(12) United States Patent
Robb et al.

(10) Patent No.: US 7,102,199 B2
(45) Date of Patent: Sep. 5, 2006

(54) LOW VOLTAGE TRANSIENT VOLTAGE SUPPRESSOR AND METHOD OF MAKING

(75) Inventors: Francine Y. Robb, Tempe, AZ (US); Jeffrey Pearse, Chandler, AZ (US); David M. Heminger, Mesa, AZ (US); Stephen P. Robb, Tempe, AZ (US)

(73) Assignee: Semiconductor Components Industries L.L.C., Phoenix, AZ (US)

( * ) Notice: Subject to any disclaimer, the term of this patent is extended or adjusted under 35 U.S.C. 154(b) by 0 days.

(21) Appl. No.: 10/406,106

(22) Filed: Apr. 4, 2003

(65) Prior Publication Data
US 2003/0205762 A1   Nov. 6, 2003

Related U.S. Application Data

(62) Division of application No. 09/849,720, filed on May 4, 2001, now Pat. No. 6,633,063.

(51) Int. Cl.
*H01L 23/62* (2006.01)

(52) U.S. Cl. ............... 257/360; 257/328; 257/546

(58) Field of Classification Search ........ 257/328, 257/355, 360, 546
See application file for complete search history.

(56) References Cited

U.S. PATENT DOCUMENTS

| | | | | |
|---|---|---|---|---|
| 4,072,957 A | * | 2/1978 | Kokaji et al. | 346/74.2 |
| 4,246,502 A | * | 1/1981 | Kubinec | 327/566 |
| 4,288,829 A | * | 9/1981 | Tango | 361/56 |
| 4,689,871 A | * | 9/1987 | Malhi | 438/270 |
| 4,760,434 A | * | 7/1988 | Tsuzuki et al. | 257/49 |
| 4,829,350 A | * | 5/1989 | Miller | 257/357 |
| 6,246,092 B1 | * | 6/2001 | Fujihira et al. | 257/341 |
| 6,674,123 B1 | * | 1/2004 | Kim | 257/328 |

\* cited by examiner

*Primary Examiner*—N. Drew Richards
(74) *Attorney, Agent, or Firm*—Kevin B. Jackson

(57) ABSTRACT

A method of providing a Transient Voltage Suppression (TVS) device is described utilizing a Metal Oxide Semiconductor (MOS) structure and an Insulated Gate Bipolar Transistor (IGBT) structure. The MOS based TVS devices offer reduced leakage current with reduced clamp voltages between 0.5 and 5 volts. Trench MOS based TVS device (72) provides an enhanced gain operation, while device (88) provides a top side drain contact. The high gain MOS based TVS devices provide increased control over clamp voltage variation.

5 Claims, 8 Drawing Sheets

LOW VOLTAGE TRANSIENT VOLTAGE SUPPRESSOR AND METHOD OF MAKING

This application is a divisional of U.S. application Ser. No. 09/849,720, filed on May 4, 2001, now U.S. Pat. No. 6,633,063.

BACKGROUND OF THE INVENTION

The present invention relates in general to Transient Voltage Suppression (TVS) devices and, more particularly, to low voltage TVS devices.

Virtually all electronic devices are susceptible to transient perturbations such as electrostatic discharge or electromagnetically coupled interference. The perturbations most often occur at the Input/Output (I/O) interfaces to the electronic devices. Typical examples of I/O interfaces susceptible to the transient perturbations, or signals, are power supply input terminals and data bus terminals to name only a few.

Zener or avalanche diodes, to be referred to as TVS junction diodes, have typically been used to protect the electronic devices from damage caused by the transient voltage signals. TVS junction diodes placed into electronic devices for transient suppression are reverse biased under normal, non-transient conditions. During transient conditions, however, the reverse bias voltage exceeds the reverse breakdown voltage and the TVS junction diode clamps the transient voltage to be equal to the reverse breakdown voltage of the diode, thereby preventing the transient voltage from exceeding the maximum voltage that can be sustained by the electronic device.

Prior art TVS junction diodes perform well for high voltage (>5 volt) applications, but pose specific detrimental characteristics in low voltage (<5 volt) applications. The detrimental characteristics of low voltage TVS junction diodes include high leakage current and high capacitance. Battery operated electronic devices using TVS junction diodes for transient voltage protection are particularly vulnerable to leakage current caused by the TVS junction diode, since the battery provides limited current capability. TVS junction diodes operating in the low (<5V) voltage range typically demonstrate leakage current in the milliamp (mA) range.

Electronic devices today are designed to operate at battery supplied potentials below 5 volts, such as 3 volts and 1.8 volts or even lower. The current requirements of the battery operated circuits are being driven lower as well. TVS junction diode protection devices are no longer acceptable in the lower voltage ranges due to the excessive leakage current properties below 5 volts. Prior art TVS devices, such as a punch-through, 3-layer devices, while achieving low voltage protection at low leakage current, exhibit several undesirable characteristics, such as negative resistance, or snapback, and lack of punch-through voltage control. Consequently, the punch-through voltage obtained from device to device is randomly distributed.

Hence, there is a need for a TVS device capable of operation in the sub-5 volt range, with no snapback, acceptable leakage current and low capacitance, having tight control over the clamping voltage.

DETAILED DESCRIPTION OF THE DRAWINGS

Figure 1:
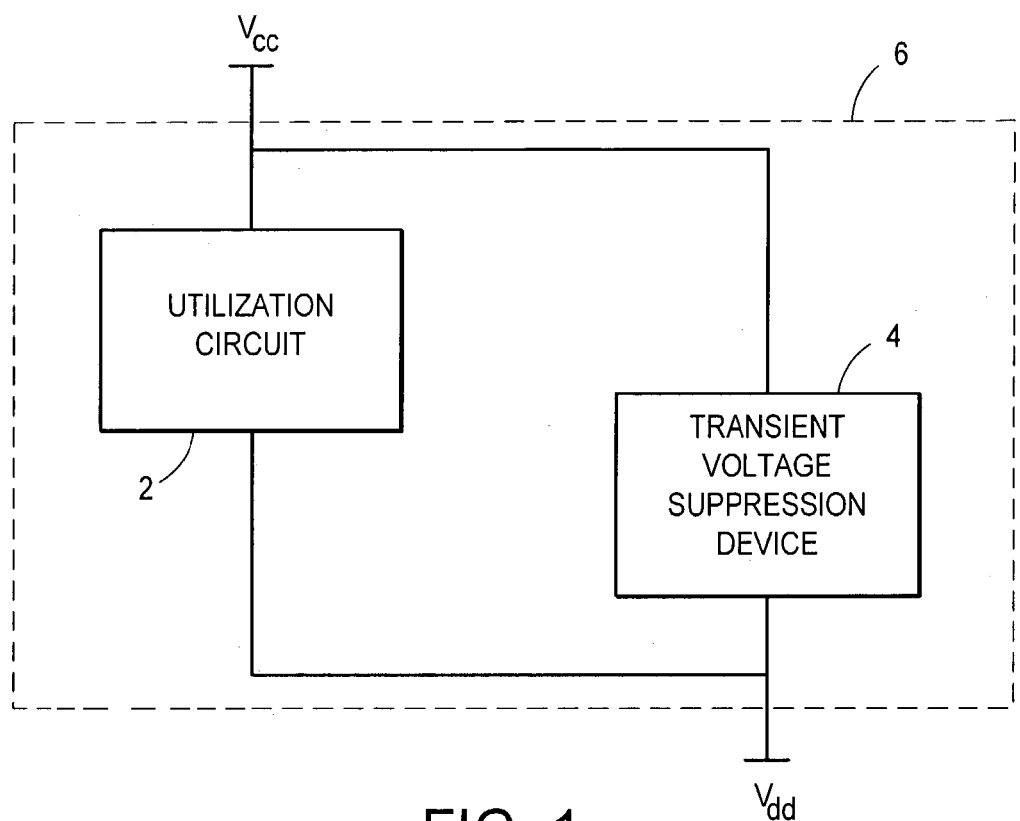
FIG. 1 is an application diagram illustrating a TVS device.

In FIG. 1, an application of TVS device 4 is illustrated whereby TVS device 4 isolates utilization circuit 2 from voltage transients present on power supply terminals $V_{cc}$ and $V_{dd}$. TVS device 4 is effective to suppress both negative and positive transient potentials across utilization circuit 2. It should be noted, that various other applications exist for TVS device 4, such as a protection device used for I/O data lines and various other interfaces. Block 6 may denote an integrated circuit, for example, whereby utilization circuit 2 and TVS device 4 coexist on the same die. Conversely, block 6 may denote a printed circuit board, for example, whereby TVS device 4 is a discrete component providing protection to utilization circuit 2.

Figure 2:
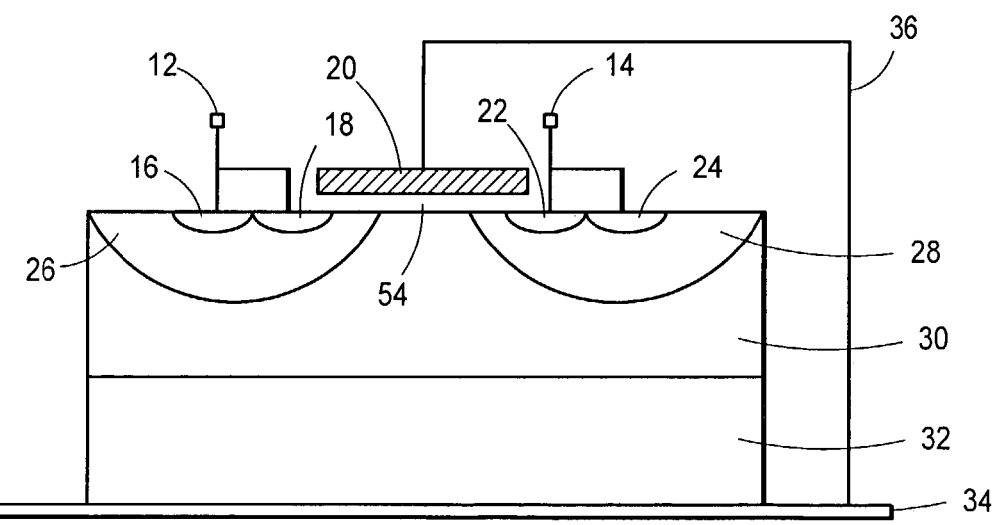
FIG. 2 is a diagram illustrating a Metal Oxide Semiconductor (MOS) device used as a low voltage, TVS device.

Turning to FIG. 2, a vertical MOS device 10 is illustrated, having source terminals 12 and 14, gate terminal 20 and drain terminal 34. Drain terminal 34 is the header of the package encapsulating TVS device 10. Regions 18 and 22 are N$^+$ doped regions and regions 16 and 24 are P$^+$ doped regions. Regions 26 and 28 form P$^-$ doped well regions. Region 30 is a N$^-$ drift region and region 32 is a N$^+$ region. An advantage of the structure of TVS device 10 is the gate to drain connection 36. Connection 36 provides that the drain voltage $V_d$ and the gate voltage $V_g$ are equivalent and is typically connected to the I/O pin requiring protection, such as a supply terminal or a data terminal. It should be noted that the device illustrated in FIG. 2 is very similar to an Insulated Gate Bipolar Transistor (IGBT), where the drain terminal is replaced by a collector terminal of the IGBT and region 32 is doped P$^+$ instead of N$^+$. Connection 36 can be an external connection used for discrete MOS or IGBT packages or can be integrated into the device during the manufacturing stage of the device.

Figure 3:
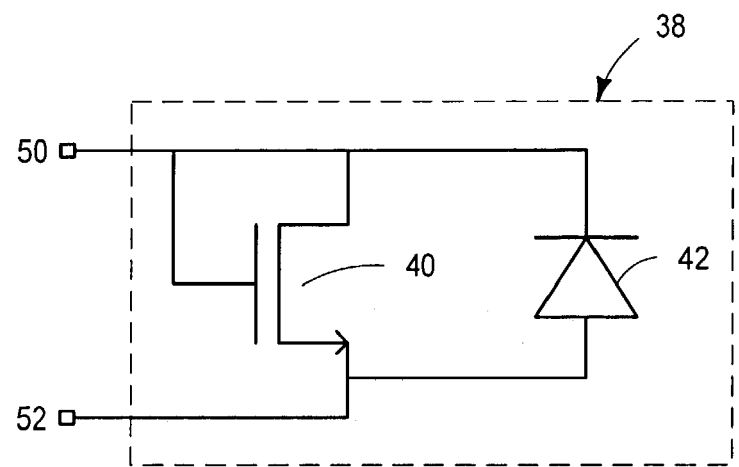
FIG. 3 is a schematic diagram illustrating the equivalent circuit of the voltage suppression device of FIG. 2.

Turning to FIG. 3, an equivalent circuit 38 of the TVS device of FIG. 2 is illustrated. N-type MOS (NMOS) device 40 is shown to be connected in parallel with diode 42, such that the drain terminal of transistor 40 is coupled to the gate terminal of transistor 40 and the cathode terminal of diode 42. The anode of diode 42 is coupled to the source terminal of transistor 40 at ground potential, for example. Diode 42 is an intrinsic diode created within MOS device 40 by the P-N interface between regions 28 and 30 and between regions 26 and 30. Terminals 50 and 52 are considered to be the cathode and anode connections, respectively, of TVS device 38. Using terminals 50 and 52 as the cathode and anode conductors of a two-terminal TVS device, TVS device 38 is used as a drop in replacement for most TVS junction diode applications.

Figure 4:
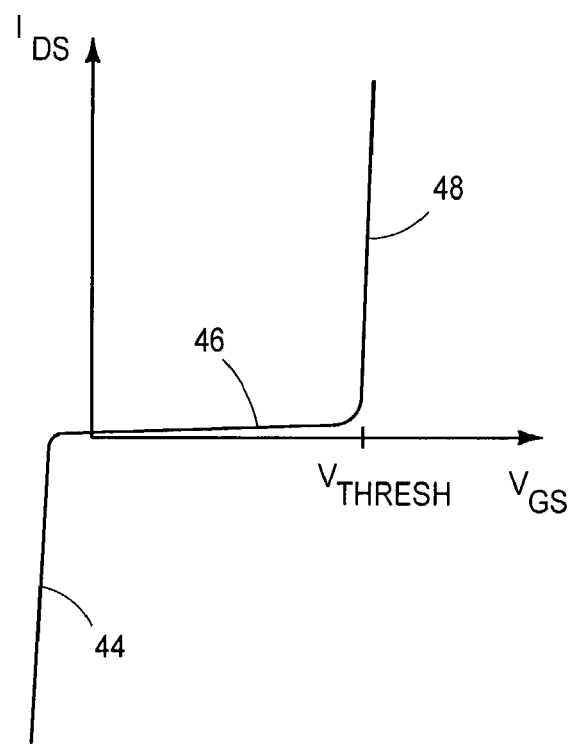
FIG. 4 is a threshold curve useful in explaining the operation of the TVS device of FIG. 2.

The anode of diode 42 is coupled to ground potential, for example, at the source terminal of transistor 40. A negative potential, exceeding the barrier potential of diode 42, applied at the drain terminal of transistor 40 and the cathode terminal of diode 42, causes diode 42 to become forward biased. FIG. 4 illustrates conductive region 44 of intrinsic diode 42. Once the potential across diode 42 has exceeded the barrier potential of diode 42, negative drain to source current is conducted by diode 42, substantially limiting the potential drop across diode 42 to the barrier potential. As the negative drain to source current increases through diode 42, however, the voltage drop across diode 42 increases slightly as shown in region 44.

Region 46 of FIG. 4 denotes a region where NMOS transistor 40 and diode 42 are substantially non-conductive. As the gate to source voltage, $V_{gs}$, of NMOS transistor 40 increases toward the threshold voltage, $V_{thresh}$, a small amount of current conducts from the drain terminal of transistor 40 to the source terminal of transistor 40. The small amount of current conducted by TVS device 38 in region 46 is known as the sub-threshold leakage current. Minimization of the amount of leakage current conducted in region 46 is desired to reduce power consumption of TVS device 38. The amount of leakage current conducted by either MOS or IGBT based TVS device 38 is typically in the nanoamp (nA) range, while the amount of leakage current conducted by a sub-5V TVS junction diode is typically in the milliamp (mA) range. The substantial decrease in the amount of power consumed by TVS device 38, therefore, is a distinct advantage over the use of standard, TVS junction diode based transient voltage suppressors.

Region 48 of FIG. 4 defines the forward conductive region of TVS device 38. Once the voltage at the gate and drain terminals of transistor 40 exceeds the threshold voltage of transistor 40, transistor 40 becomes conductive, substantially maintaining a constant gate to source voltage, or clamp voltage. Since the threshold voltage of the MOS or IGBT based TVS device is readily varied between approximately 0.5 volts and 5.0 volts using implantation adjustments, the clamp voltage is easily adjusted. MOS or IGBT based TVS devices provide operation in the sub-5 volt region with low leakage current capability. The slope of the curve in region 48 is increased to near vertical through increasing the gain of the MOS or IGBT device.

A further advantage of using MOS or IGBT based TVS devices include protection of the gate oxide from voltage transients through the use of the intrinsic diode 42. As can be seen in FIG. 4, region 44 is a limitation of the negative excursion of the gate to source voltage by body diode 42. Body diode 42 also protects the gate oxide from rupture with positive gate-source over-voltages, depending on the breakdown voltage of diode 42. Another advantage exhibited by the MOS or IGBT based TVS device is the low series resistance and low capacitance, which is controlled by the doping of region 30. A further advantage is the gain control of TVS device 38, through the proper selection of the thickness of gate oxide layer 54 and the channel packing density.

Figure 5:
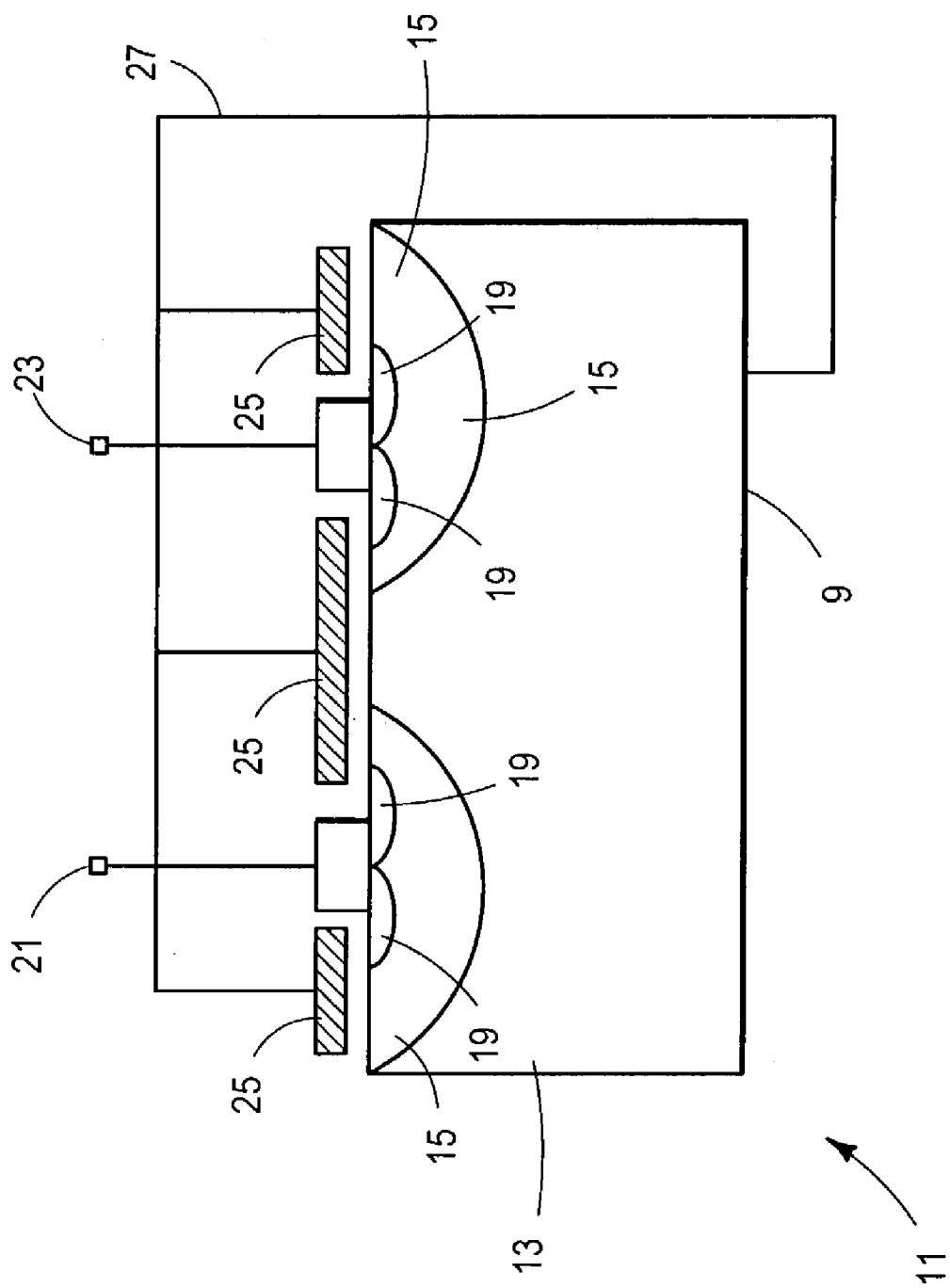
FIG. 5 is a diagram illustrating a MOS device used as a symmetrical, clipping TVS device.

FIG. 5 illustrates a vertical MOS clipping device 11 having multiple gate electrodes 25 interconnected using conductor 27 and having a common connection to drain 9. Source electrodes 21 and 23 provide the external connections to TVS device 11. Source regions 19 are $N^+$ doped and are formed inside P-well regions 15. Region 13 is an N doped region.

Figure 6:
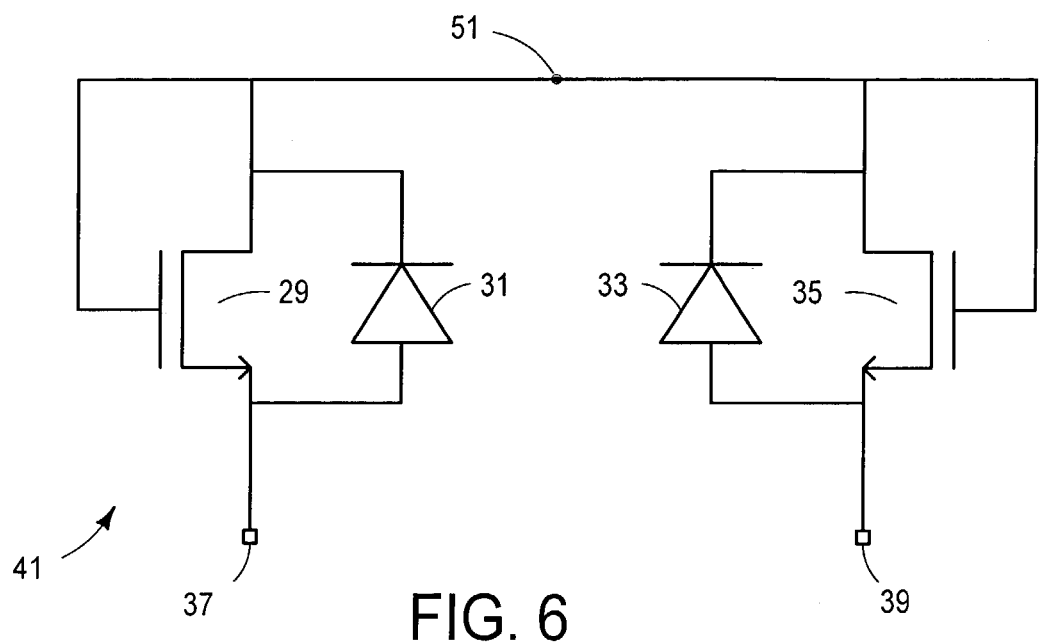
FIG. 6 is a schematic diagram illustrating the equivalent circuit of the symmetrical, clipping TVS device of FIG. 5.

Turning to FIG. 6, an equivalent circuit 41 of the TVS device of FIG. 5 is illustrated. N-type MOS (NMOS) device 29 is shown to be connected in parallel with diode 31, such that the drain terminal of transistor 29 is coupled to the gate terminal of transistor 29 and the cathode terminal of diode 31. The anode of diode 31 is coupled to the source terminal of transistor 29. Additionally, NMOS device 35 is shown to be connected in parallel with diode 33, such that the drain terminal of transistor 35 is coupled to the gate terminal of transistor 35 and the cathode terminal of diode 33. The anode of diode 33 is coupled to the source terminal of transistor 35. Diodes 31 and 33 are intrinsic diodes created within MOS devices 29 and 35 by the P-N interface between regions 15 and 13. Terminals 21 and 23 are the external connections of TVS device 11. The gate terminals of transistors 29 and 35 are coupled together at the cathode terminals of diodes 31 and 33.

Figure 7:
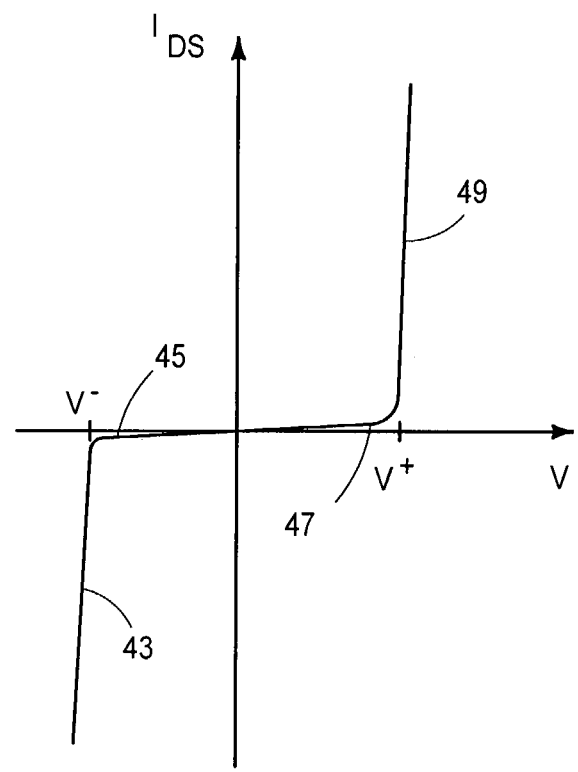
FIG. 7 is a threshold curve useful in explaining the operation of the symmetrical TVS device of FIG. 5.

FIG. 7, in combination with FIG. 6, illustrates the operation of TVS device 41. A positive voltage, $V_{37}$, is applied at terminal 37 with respect to terminal 39. Diode 31 is forward biased and places a potential, $V_{51}$, at node 51, where $V_{51}$ is defined by the following equation, $V_{51}=V_{37}-V_{31}$, where $V_{31}$ is the barrier potential of diode 31. When $V_{51}$ increases above the threshold voltage of transistor 35, transistor 35 becomes conductive and creates a current path from terminal 37, through diode 31, through transistor 35 to terminal 39. Transistor 29 remains non-conductive, since the source voltage of transistor 29 exceeds the gate voltage of transistor 29. The voltage at terminal 37, therefore, is clamped to the threshold voltage of transistor 35 added to the barrier potential of diode 31, indicated as $V^+$ in FIG. 7. Conversely, a positive voltage, $V_{39}$, is applied at terminal 39 with respect to terminal 37. Diode 33 is forward biased and places a potential, $V_{51}$, at node 51, where $V_{51}$ is defined by the following equation, $V_{51}=V_{39}-V_{33}$, where $V_{33}$ is the barrier potential of diode 33. When $V_{51}$ increases above the threshold voltage of transistor 29, transistor 29 becomes conductive and creates a current path from terminal 39, through diode 33, through transistor 29 to terminal 37. Transistor 35 remains non-conductive, since the source voltage of transistor 35 exceeds the gate voltage of transistor 35. The voltage at terminal 39, therefore, is clamped to the threshold voltage of transistor 29 added to the barrier potential of diode 33, indicated as $V^-$ in FIG. 7. Regions 45 and 47 denote regions where NMOS transistor 29, diode 31, NMOS transistor 35 and diode 33 are substantially non-conductive. The TVS device of FIG. 6, therefore, provides a circuit which suppresses both positive and negative excursions of transient potentials applied across terminals 37 and 39 in a symmetrical manner.

Figure 8:
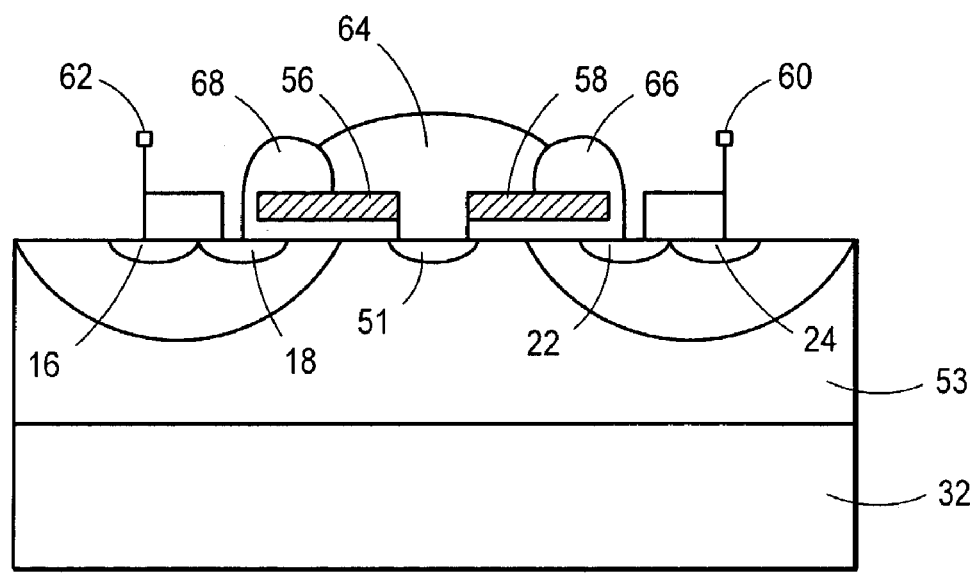
FIG. 8 illustrates a MOS device with an integral gate-drain connection used as a TVS device.

FIG. 8 illustrates an alternate TVS device utilizing a split gate MOS structure and an integral gate-drain connection. The device of FIG. 8 demonstrates the capability of providing on-chip gate to drain connections, obviating the need for a connection strap between the gate to drain terminal as shown in FIG. 2. Split gate terminals 56 and 58 overlap source regions 18 and 22. Metal layer 64 provides contact to gate terminals 56 and 58, while insulating layers 68 and 66 provide the required electrical isolation between gate and source terminals. $N^+$ region 51 provides the integrated contact to $N^-$ drift region 53 to complete the gate to drain connection.

Figure 9:
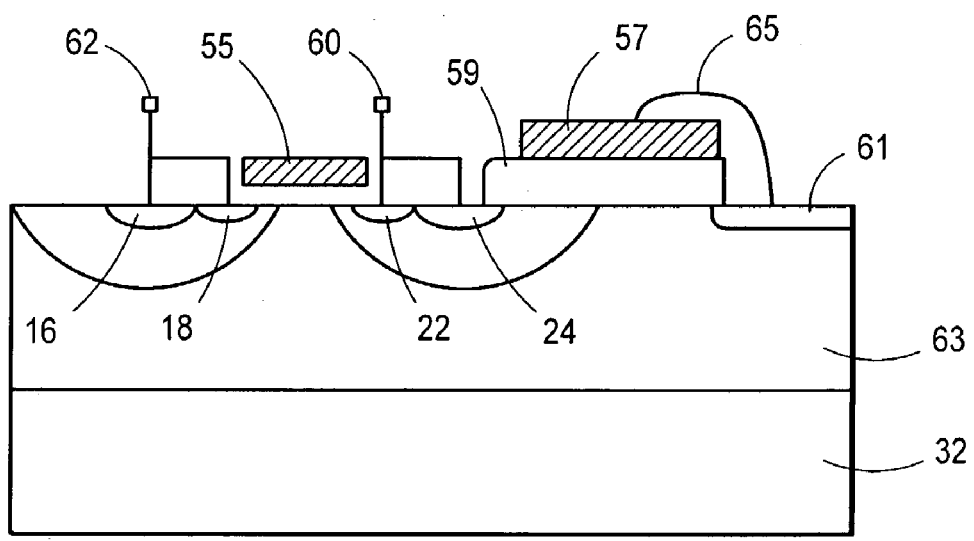
FIG. 9 illustrates an alternate MOS device with an integral gate-drain connection used as a TVS device.

FIG. 9 illustrates an alternate TVS device using gate feed 57 and metal strap 65 to provide an electrical contact to $N^+$ region 61. Scribe grid 63 is an N doped region making contact with N+ substrate 32 to complete the gate to drain connection.

Figure 10:
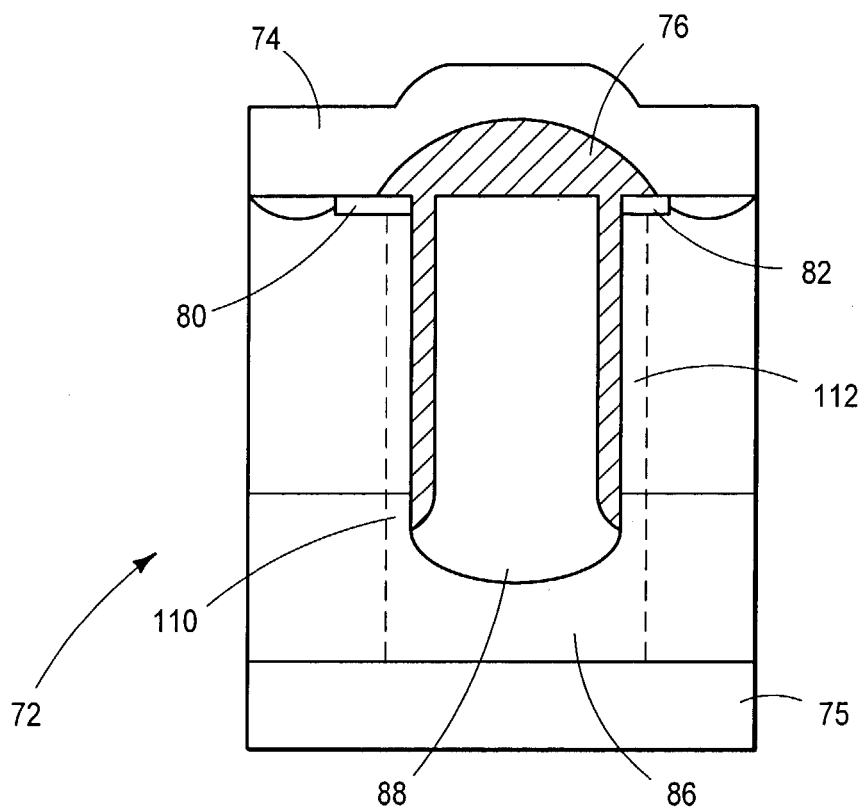
FIG. 10 illustrates a trench MOS device used as a TVS device.

FIG. 10 illustrates a trench TVS device 72 having trench gate 88 providing a built in connection to N– drift region 86, which forms the drain region. Trench gate 88 is formed using polysilicon. N+ source regions 80 and 82 are in electrical contact to source metal layer 74. Oxide layer 76 is formed, which provides the proper isolation between polysilicon gate 88 and source regions 80 and 82. An anisotropic spacer etch is used to provide the built in connection between gate 88 and drain region 86. N+ drain contact region 75 provides the drain contact to device 72. It should be noted that TVS device 72 is easily converted into an IGBT device having emitter regions 80 and 82 by making drain contact region into a P+ doped collector region. Once TVS device 72 becomes conductive, due to the voltage applied across the gate and source terminals of TVS device 72 exceeding the threshold voltage of TVS device 72, conduction channels 110 and 112 form along the vertical sidewalls of gate 88. Once current begins to flow through TVS device 72, the gate to source voltage of TVS device 72 is held substantially equal to $V_{thresh}$ as shown in region 48 of FIG. 4. The gain of TVS device 72 can be increased due to the higher packing density of channels 110 adn 112 in the trench configuration. As stated earlier, higher gain values of the TVS device tends to increase the slope of the voltage curve in region 48 of FIG. 4 to approach near vertical slope, providing greater control over the clamping voltage.

Figure 11:
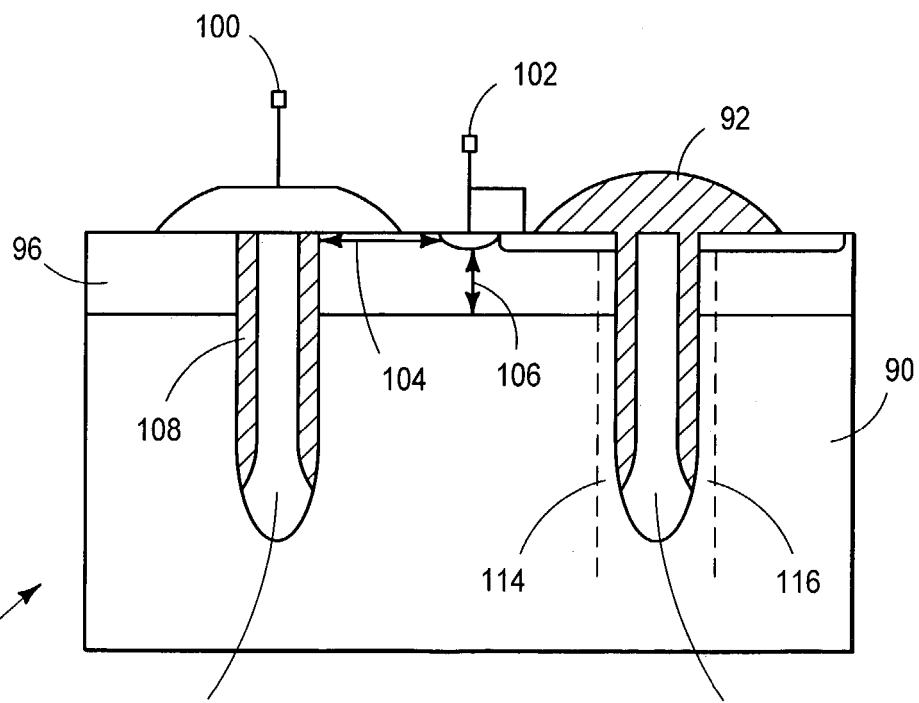
FIG. 11 illustrates a modified trench MOS device with topside drain contact.

FIG. 11 illustrates a trench TVS device 88, which utilizes trench gate 98 to make contact with N+ buried layer or substrate 90, which ultimately creates the contact to drain plug 94. Source contact 102 and drain contact 100 provide the electrical interconnects to TVS device 88, while the gate to drain connection is inherent within the structure of TVS device 88, specified above. Conduction channels 114 and 116 form along gate 98 when the gate to source voltage applied to TVS device 88 exceeds the threshold voltage of TVS device 88. Distance 104 is held to be greater than distance 106 in order to ensure that breakdown occurs along the vertical path defined by channels 114 and 116, instead of the horizontal path defined by 104. Proper conduction during a transient event occurs along conduction channels 114 and 116, horizontally across N+ buried layer 90 and up through drain plug 94. The gain exhibited by TVS device 88 is high, which results in near vertical breakdown voltage slope in region 48 of FIG. 4.

Figure 12:
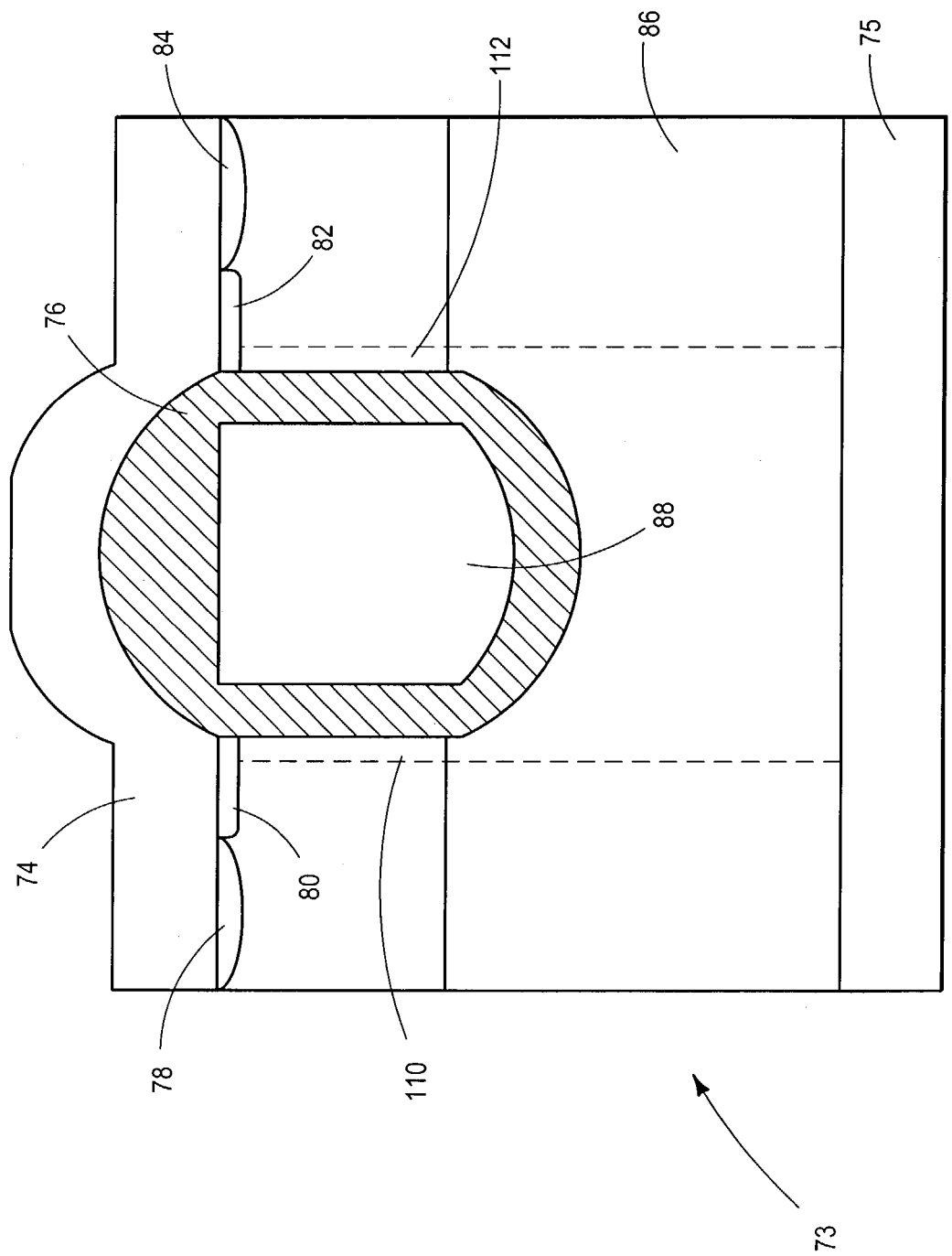
FIG. 12 illustrates an alternate trench device used as a TVS device.

FIG. 12 illustrates TVS device 73, which is similar to TVS device 72, illustrated in FIG. 10, except that the gate region 88 does not directly contact the N– drift region 86. Contact between drain region 75 and gate region 88 is achieved externally or at the edge terminations of TVS device 73. It should be noted that TVS device 73, having N+ emitter regions, is easily converted into an IGBT device by replacing N+ drain region 75 by a P+ collector region.

Figure 13:
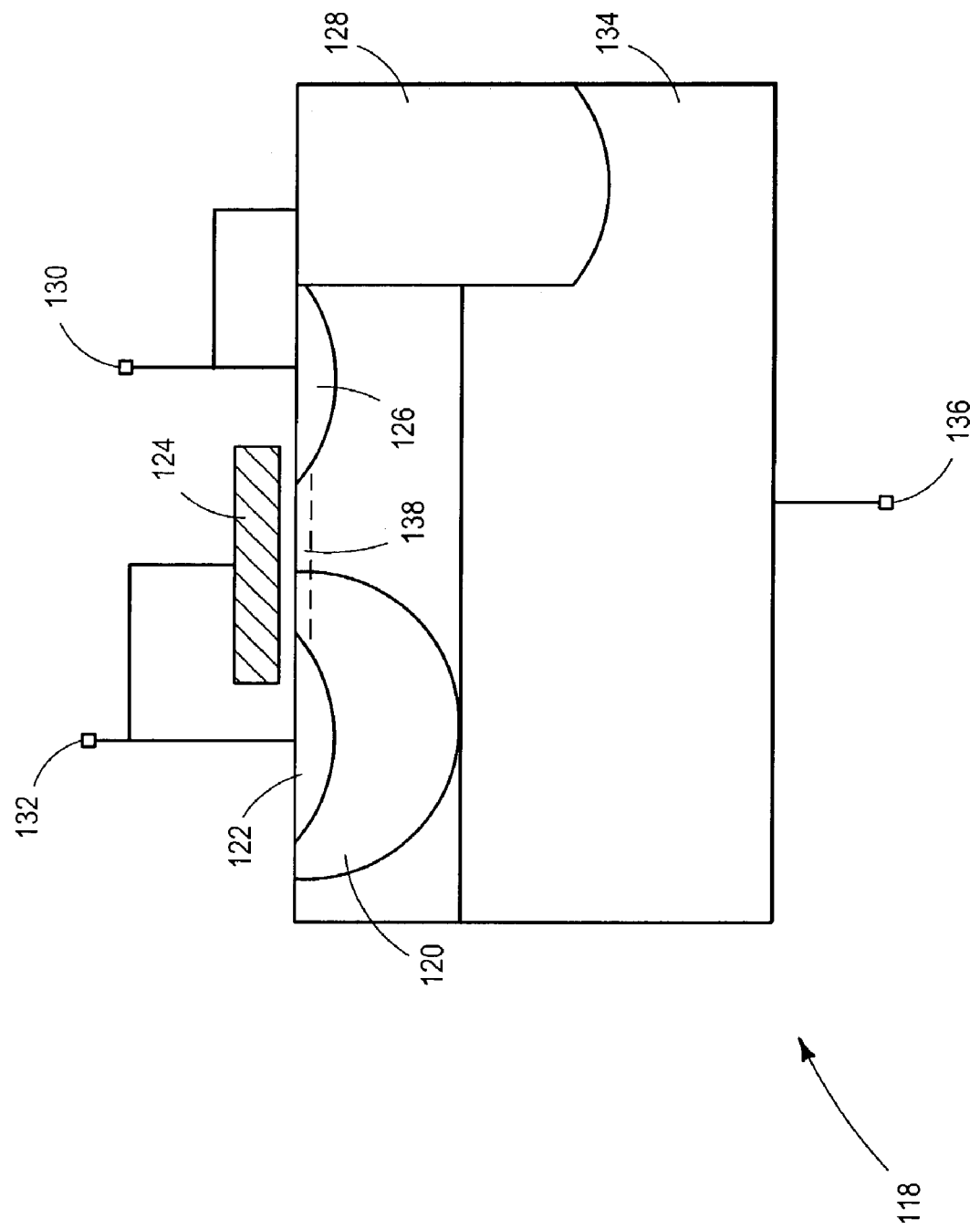
FIG. 13 illustrates a lateral MOS device used as a TVS device.

FIG. 13 illustrates lateral TVS device 118 having source contacts 130 and 136 and an electrical connection 132 between drain 122 and gate 124. Drain and source regions, 122 and 126 respectively, are N+ doped regions. Region 120 is an N– doped region, forming a built-in punchthrough diode with P+ substrate 134. The punchthrough is designed to occur above the threshold of TVS device 118 at between 6–10 volts, for example. The punchthrough diode provides an additional current path for handling high surge currents. P+ sinker region 128 provides a topside substrate contact.

In summary, several methods of providing a TVS device using MOS and IGBT structures are presented. The TVS devices exhibit superior leakage current performance, while allowing for clamping voltages in the sub-5 volt range. Clamping voltages between 0.5 volts and 5 volts are readily available through implantation control and high gain allows relatively constant clamping voltage characteristics.

What is claimed is:

1. A semiconductor device for suppressing an external transient voltage, comprising:
    a drift region of a first conductivity type and having a first surface;
    a first region formed adjacent the drift region, wherein the drift region is formed over the first region, and wherein the first region forms a second surface;
    a second region of a second conductivity type formed in the drift region at the first surface;
    a third region of the second conductivity type formed in the second region;
    a source region of the first conductivity type formed in the second region;
    a gate terminal formed adjacent the source region and the second region at the first surface;
    a first conduction terminal coupled to the first region at the second surface, wherein the first terminal is coupled to the gate terminal to operate at the external transient voltage, and wherein the first terminal is directly coupled to the gate terminal without any intervening semiconductor regions by at least one of a conductive layer formed overlying the semiconductor device and a conductive device external to the semiconductor device; and
    a second conduction terminal coupled to the source region and the third region to establish with the first conduction terminal a path for a surge current resulting from the transient voltage.

2. The semiconductor device of claim 1, wherein the first region comprises the first conductivity type.

3. The semiconductor device of claim 2, wherein the second conduction terminal is formed at the first surface.

4. The semiconductor device of claim 1, wherein first region comprises the second conductivity type.

5. The semiconductor device of claim 1, further comprising a package having a first pin for coupling to the first conduction terminal and a second pin coupled to the second conduction terminal.

* * * * *